United States Patent
Nagai et al.

(10) Patent No.: US 6,661,162 B1
(45) Date of Patent: Dec. 9, 2003

(54) PIEZOELECTRIC RESONATOR AND METHOD OF PRODUCING THE SAME

(75) Inventors: Mitsuru Nagai, Minowa-machi (JP); Yoshiharu Kasuga, Ina (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/508,168

(22) PCT Filed: Jul. 23, 1999

(86) PCT No.: PCT/JP99/03977

§ 371 (c)(1),
(2), (4) Date: Mar. 8, 2000

(87) PCT Pub. No.: WO00/05812

PCT Pub. Date: Feb. 3, 2000

(30) Foreign Application Priority Data

Jul. 24, 1998 (JP) .......................................... 10-210017

(51) Int. Cl.[7] ............................................... H03H 3/02
(52) U.S. Cl. ..................................................... 310/340
(58) Field of Search .................... 310/366, 312, 310/340, 364, 365, 310; 259/25.35; H03H 3/02, 9/13

(56) References Cited

U.S. PATENT DOCUMENTS

| 5,178,682 A | * | 1/1993 | Tsukamoto et al. ..... 257/21.123 |
| 5,918,354 A | * | 7/1999 | Ikegami et al. ............. 310/340 |
| 6,114,795 A | * | 9/2000 | Tajima et al. ............... 310/366 |

FOREIGN PATENT DOCUMENTS

| JP | 57-36019 | 8/1955 | | |
| JP | 57-98033 | 12/1955 | | |
| JP | 55083316 | * | 5/1980 | ............ H03N/9/13 |
| JP | A-55-83316 | 6/1980 | | |
| JP | A-57-32115 | 2/1982 | | |
| JP | A-57-164615 | 10/1982 | | |
| JP | A-57-171817 | 10/1982 | | |
| JP | B2-58-21965 | 5/1983 | | |
| JP | B2-58-32524 | 7/1983 | | |
| JP | U-59-125129 | 8/1984 | | |
| JP | U-60-85425 | 6/1985 | | |
| JP | B2-61-27929 | 6/1986 | | |
| JP | A-63-10815 | 1/1988 | | |
| JP | A-2-298110 | 12/1990 | | |
| JP | 57032115 | * | 2/1992 | ............ H03H/3/02 |
| JP | A-5-129874 | 5/1993 | | |
| JP | A-7-212161 | 8/1995 | | |
| JP | A-9-326668 | 12/1997 | | |

* cited by examiner

*Primary Examiner*—Thomas M. Dougherty
*Assistant Examiner*—Karen Beth Addison
(74) *Attorney, Agent, or Firm*—Oliff & Berridge, PLC

(57) ABSTRACT

The invention concerns a piezoelectric resonator piece of a piezoelectric resonator having electrode patterns for forming exciting electrodes each of which is composed of an under a metal layer. Each of the electrode patterns for forming conduction electrodes is composed of the under metal layer except the curved or bent portions of the sides of the piezoelectric resonator piece and each of the electrode patterns in these portions are composed of the under metal layer and a gold electrode layer. It is thus possible to provide a piezoelectric resonator in which, even when noble metal layers are partially removed for increasing adhesion of surface protecting films, exciting electrodes are not brought into an open state between the upper side and the lower side of a piezoelectric resonator piece.

4 Claims, 13 Drawing Sheets

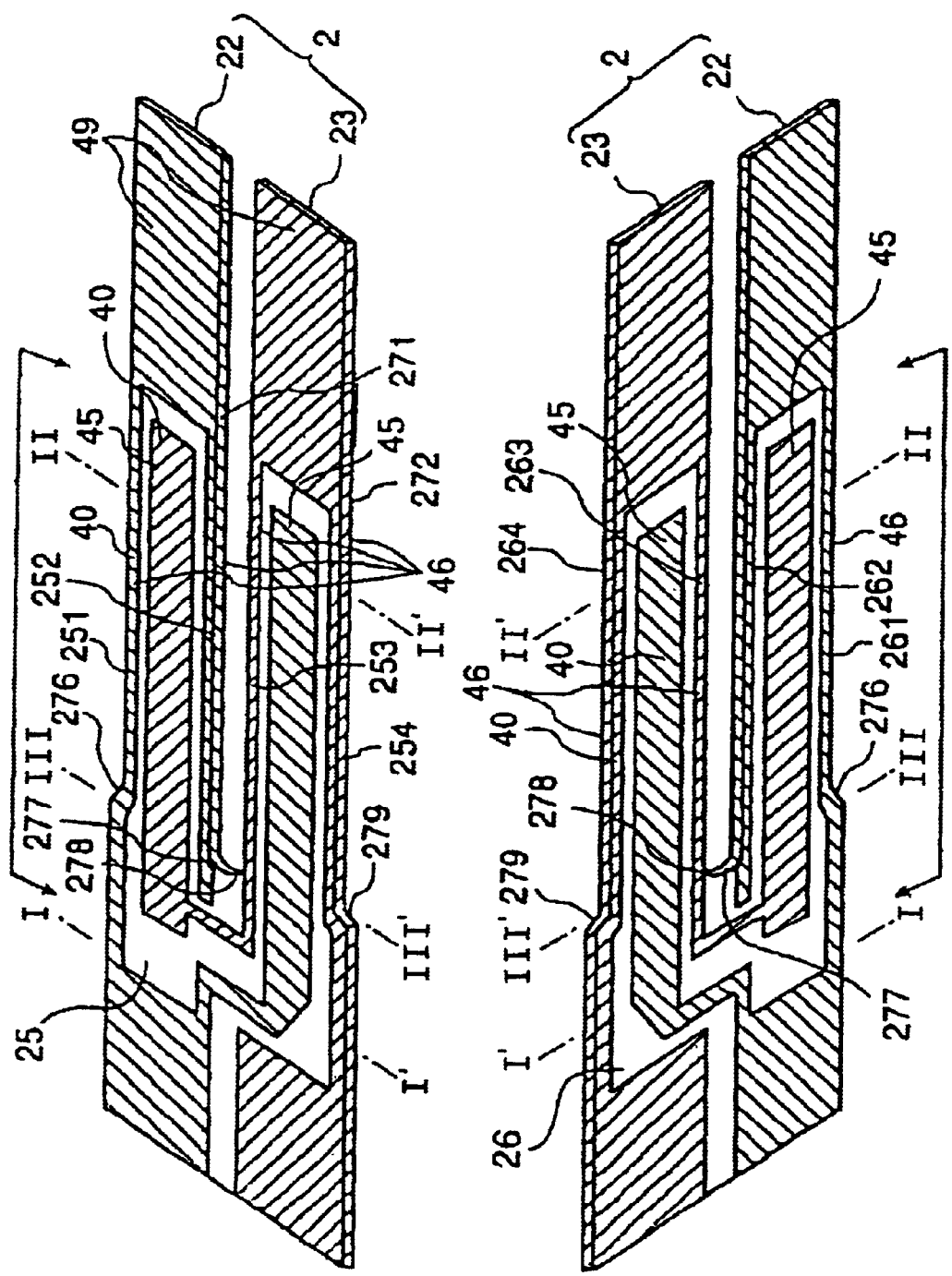

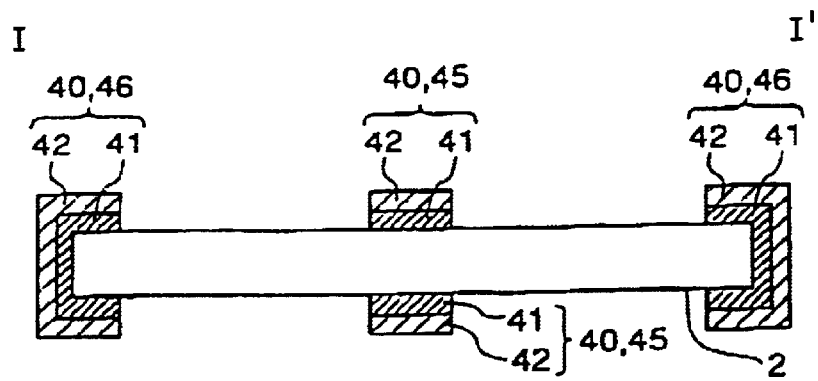
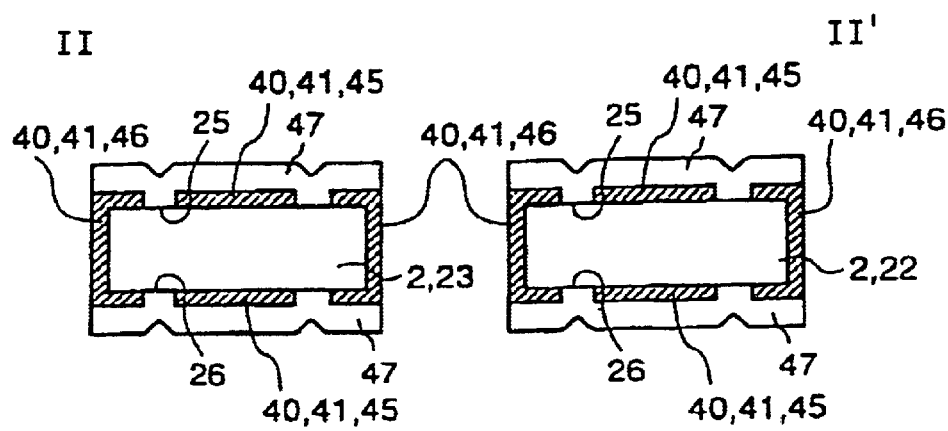
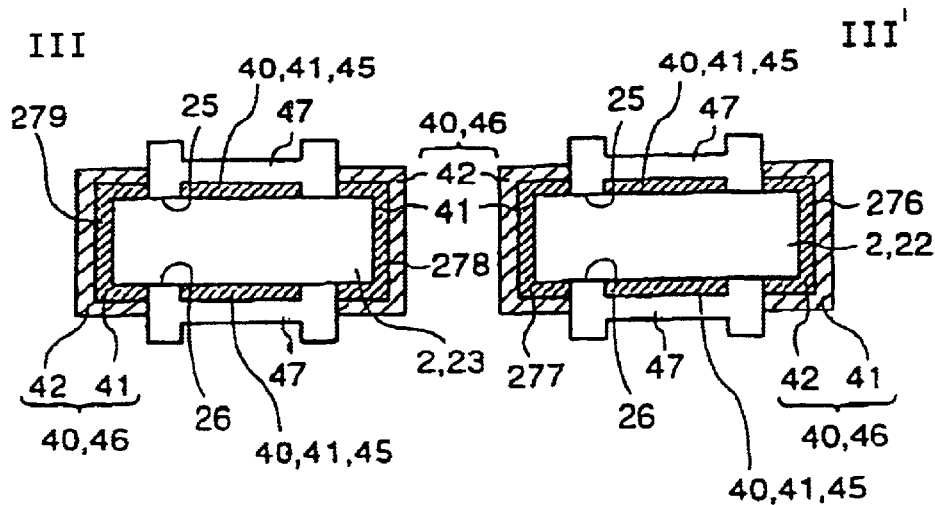

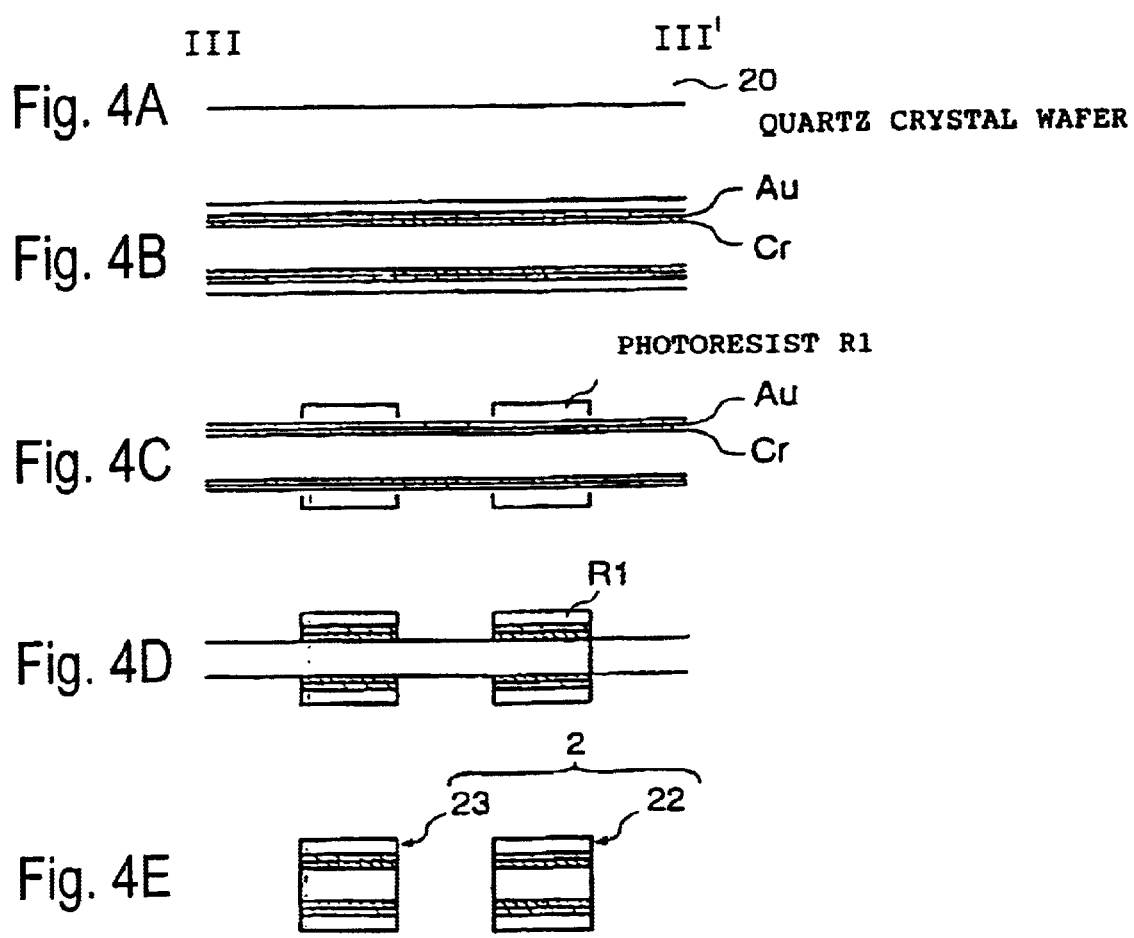

PIEZOELECTRIC RESONATOR AND METHOD OF PRODUCING THE SAME

BACKGROUND OF THE INVENTION

1. Field of the Invention

The present invention relates to a piezoelectric resonator such as a quartz crystal resonator or the like, and a method of producing the same. Particularly, the present invention relates to the technique of electrically connecting electrodes formed on a resonator piece and preventing a short circuit.

2. Description of Related Art

Of various flexural vibration mode, longitudinal vibration mode, or torsional vibration mode piezoelectric resonators, for example, as shown in FIG. 11, a tuning fork type quartz crystal resonator comprises a piezoelectric resonator piece 1002 comprising a sheet-shaped quartz crystal piece in which two arms 1022 and 1023 are extended from a base 1021, internal terminals 1031 of a plug 1030 being connected to the base 1021 of the piezoelectric resonator piece. As shown in FIGS. 12(A) and 12(B) which are perspective views of the piezoelectric resonator piece 1002 used in a piezoelectric resonator (tuning fork type quartz crystal resonator) as viewed from the upper side and the lower side, respectively, two electrode patterns 1040 are formed with a predetermined gap therebetween on each of the upper side 1025 and the lower side 1026 of the arms 1022 and 1023 of the piezoelectric resonator piece 1002 to form exciting electrodes 1045. In FIGS. 12(A) and 12(B), in order to discriminate the two electrode patterns 1040, one of the electrode patterns 1040 is shown by lines inclined to the right, the other electrode pattern being shown by lines inclined to the left.

Since the exciting electrodes 1045 are formed on each of the upper side 1025 and the lower side 1026 of the piezoelectric resonator piece 1002, the exciting electrodes 1045 formed on the upper side 1025 of the piezoelectric resonator 1002 are electrically connected to the exciting electrodes 1045 on the lower side 1026 through conduction electrodes 1046 respectively formed on the edges 1251, 1252, 1253 and 1254 of the upper side 1025, the edges 1261, 1262, 1263 and 1264 of the lower side 1026, and the sides 1271 and 1272. Therefore, portions of the electrode patterns 1040, which are formed on the base 1021, are used as mounts, and the inner leads 1031 are electrically connected to the mounts with solder or a conductive adhesive so that an AC voltage is applied to the exciting electrodes 1045 through the inner leads 1031 to vibrate the arms 1022 and 1023 at a predetermined frequency.

In the piezoelectric resonator 1001 having the above construction, in some cases, the electrode patterns 1040 are formed in a chromium single layer However, in order to decrease the electric resistance of the electrode patterns 1040, a noble metal layer such as a gold electrode layer, a silver electrode layer, or the like is used. However, the direct formation of a gold electrode layer on the surface of the piezoelectric resonator piece 1002 deteriorates adhesion between the piezoelectric resonator piece 1002 and the gold electrode layer. Therefore, as shown in FIG. 13(A) which is a sectional view taken along line IV—IV of FIG. 12 showing the piezoelectric resonator piece 1002 used in a conventional piezoelectric resonator, under metal layers 1041 each comprising a chromium layer are formed as under layers even when gold electrode layers 1042 are used for the electrode patterns 1040.

On the other hand, in the arms 1022 and 1023 of the piezoelectric resonator (quartz crystal resonator) 1, the gap between the electrode patterns 1040 is as small as the $\mu m$ order, and thus a short circuit readily occurs between the electrode patterns 1040. Therefore, as shown in FIGS. 13(B) and 13(C) which are sectional views taken along lines V–V' and VI—VI, respectively, of FIGS. 12(A) and 12(B), surface protecting films 1047 each comprising a silicon oxide film are formed on the surfaces of the electrode patterns 1040 by sputtering. However, the silicon oxide films (the surface protecting films 1047) have poor adhesion to the gold electrode layers 1042, and thus the gold electrode layers 1042 are removed from the arms 1022 and 1023 to expose the under metal layers 1041 each comprising a chromium layer so that the surface protecting films 1047 are formed on the under metal layers 1041.

As shown in FIG. 13(A), the gap between the electrode patterns 1040 in the base 1021 side is large, and thus no short circuit occurs between the electrode patterns 1040. Also, from the viewpoint of soldering between the inner leads 1031 of the plug 1030 and the mount, as shown in FIG. 11, the gold metal layers 1042 are preferably formed. Therefore, as shown in FIG. 13(A), each of the electrode patterns 1040 has a two-layer structure comprising the under metal layer 1041 and the gold electrode layer 104 without the surface protecting film 1047.

Furthermore, in the conventional piezoelectric resonator 1001, the exciting electrodes 1045 are formed on each of the upper side 1025 and the lower side 1026 of the piezoelectric resonator piece 1002, and the exciting electrodes 1045 formed on the upper side 1025 of the piezoelectric resonator 1002 are electrically connected to the exciting electrodes 1045 on the lower side 1026 through the conduction electrodes 1046 respectively formed on the edges 1251, 1252, 1253 and 1254 of the upper side 1025, the edges 1261, 1262, 1263 and 1264, of the lower side 1026, and the sides 1271 and 1272. However, each of the electrode patterns 1040 corresponding to the conduction electrodes 1046 comprises only the under metal layer 1041 comprising a chromium layer, thereby causing a problem in that the exciting electrodes 1045 formed on the upper side 1025 and the exciting electrodes 1045 formed on the lower side 1026 are readily brought into an open state. Namely, the under metal layer 1041 comprising a chromium layer which forms each of the conduction electrodes 1046 comprises a hard film, and thus cracks occurs in the curved or bent portions 1276, 1277, 1278 and 1279 of the sides 1271 and 1272 of the piezoelectric resonator piece 1002 to easily cause disconnection. In forming a mask for partially etching the gold electrode layers 1042 formed on the surfaces of the under metal layers 1041 comprising chromium layers, in some cases, misalignment occurs to cause the chromium layers (the under metal layers 1041) to be etched off by etching the gold electrode layers 1042, thereby producing defects in the conduction electrodes 1046 comprising chromium layers (the under metal layers 1041). In this way, the exciting electrodes 1045 on the upper side 1025 of the piezoelectric resonator piece 1002 and the exciting electrodes 1045 on the lower side 1026 thereof are brought into an open state by disconnection of the conduction electrodes 1046, causing the problem of increasing the CI value (crystal impedance/the resistance value when the mechanical vibration system of a resonator is represented by an equivalent circuit comprising a series resonant circuit containing resistance, capacitance and impedance, and parallel capacitance provided in parallel with the series resonant circuit) or disenabling oscillation.

SUMMARY OF THE INVENTION

An object of the present invention is to solve the above problems and provide a piezoelectric resonator in which exciting electrodes formed on the upper and lower sides of a piezoelectric resonator piece are not brought into an open state even when noble metal layers are partially removed for increasing adhesion of surface protecting films, and a method of producing the same.

The present invention provides a piezoelectric resonator comprising a flat plate piezoelectric resonator piece; exciting electrodes formed on each of the upper side and lower side of the piezoelectric resonator piece by electrode patterns formed on the piezoelectric resonator piece; conduction electrodes respectively formed by the electrode patterns on the edges of the upper side, the edges of the lower side, and the sides of the piezoelectric resonator piece so as to electrically connect the exciting electrodes; and insulating surface protecting films formed on the upper and lower sides of the piezoelectric resonator piece to cover at least the exciting electrodes; each of the electrode patterns comprising an under metal layer formed on the surface of the piezoelectric resonator piece, and a noble metal layer of gold or silver formed on the surface of the under metal layer; wherein each of the electrode patterns in the exciting electrodes comprises the under metal layer, and each of the electrode patterns in the conduction electrodes comprises the under metal layer except portions ranging from the upper side to the lower side through the sides of the piezoelectric resonator piece, each of the electrode patterns in the portions comprising the under metal layer and the noble metal layer.

In the present invention, the electrode patterns have a two layer structure comprising an under metal layer and a noble metal layer to decrease electric resistance, and each of the electrode patterns which constitute the exciting electrodes comprises only the under metal layer. Each of the electrode patterns which constitute the conduction electrodes also comprises only the under metal layer except portions ranging from the upper side to the lower side through the sides of the piezoelectric resonator piece. Therefore, the insulating surface protecting films formed on the upper and lower sides of the piezoelectric resonator piece to cover at least the exciting electrodes are formed on the surfaces of the piezoelectric resonator piece with high adhesion. However, in the electrode patterns which constitute the conduction electrodes, the portions ranging from the upper side to the lower side through the sides of the piezoelectric resonator piece have a two layer structure comprising the under metal layer and the noble metal layer. Therefore, even when cracks or defects occur in the under metal layers of the portions, electrical connection is ensured by the noble metal layers in the portions. Thus, the exciting electrodes formed on the upper and lower sides of the piezoelectric resonator piece are not brought into an open state, and even when the noble metal layers are partially removed for increasing adhesion of the surface protecting films, it is possible to prevent the occurrence of the problem increasing the CI value or disenabling oscillation, and realize a piezoelectric resonator having high reliability.

In the present invention, the portions of the conduction electrodes lie in regions corresponding to the curved or bent portions of the sides of the piezoelectric resonator piece.

In the present invention particularly, cracks or defects easily occur in the under metal layers which constitute the conduction electrodes in the curved or bend portions of the sides of the piezoelectric resonator piece, and thus the electrode patterns which constitute the conduction electrodes in the portions have a two layer structure comprising the under metal and the noble metal layer so that even when cracks or defects occur in the under metal layers, the noble metal layers in the portions bear electrical connection.

Therefore, it is possible to effectively prevent the exciting electrodes on the upper and lower sides of the piezoelectric resonator piece from being brought into an open state.

The present invention provides a method of producing a piezoelectric resonator comprising a flat plate piezoelectric resonator piece; exciting electrodes formed on each of the upper side and lower side of the piezoelectric resonator piece by electrode patterns formed on the piezoelectric resonator piece; conduction electrodes respectively formed by the electrode patterns on the edges of the upper side, the edges of the lower side, and the sides of the piezoelectric resonator piece so as to electrically connect the exciting electrodes; and insulating surface protecting films formed on the upper and lower sides of the piezoelectric resonator piece to cover at least the exciting electrodes; each of the electrode patterns comprising an under metal layer formed on the surface of the piezoelectric resonator piece, and a noble metal layer of gold or silver formed on the surface of the under metal layer; wherein each of the electrode patterns in the exciting electrodes comprises the under metal layer, and each of the electrode patterns in the conduction electrodes comprises the under metal layer except portions ranging from the upper side to the lower side through the sides of the piezoelectric resonator piece, the electrode patterns in the portions each comprising the under metal layer and the noble metal layer; the method comprising the first electrode pattern forming step of forming electrode patterns each of which comprises the under metal layer and the noble metal layer covering the entire surface of the under metal layer in the electrode pattern forming regions of the surface of the piezoelectric resonator piece, the first mask forming step of forming a mask which covers regions corresponding to portions of the conduction electrodes, and which has apertures in the conduction electrode forming regions excluding the portions and in the exciting electrode forming regions, the first noble metal removing step of removing the noble metal layers exposed from the apertures, the first insulating film forming step of forming insulating films for forming the surface protecting films, and then the first insulating film removing step of removing the mask to remove the insulating films deposited on the surface of the mask.

The present invention provides a method of producing a piezoelectric resonator comprising a flat plate piezoelectric resonator piece; exciting electrodes formed on each of the upper side and lower side of the piezoelectric resonator piece by electrode patterns formed on the piezoelectric resonator piece; conduction electrodes respectively formed by the electrode patterns on the edges of the upper side, the edges of the lower side, and the sides of the piezoelectric resonator piece so as to electrically connect the exciting electrodes; and insulating surface protecting films formed on the upper and lower sides of the piezoelectric resonator piece to cover at least the exciting electrodes; each of the electrode patterns comprising an under metal layer formed on the surface of the piezoelectric resonator piece, and a noble metal layer of gold or silver formed on the surface of the under metal layer; wherein each of the electrode patterns in the exciting electrodes comprises the under metal layer, and each of the electrode patterns in the conduction electrodes comprises the under metal layer except portions ranging from the upper side to the lower side through the sides of the piezoelectric resonator piece, the electrode patterns in the portions each comprising the under metal layer and the noble metal layer; the method comprising the second electrode pattern forming step of forming the under metal layers in the electrode pattern forming regions of the surface of the piezoelectric resonator piece and the noble metal layers covering the entire surfaces of the under metal layers and forming resist to cover portions of the surfaces of the noble metal layers corresponding to the electrode patterns, the second mask forming step of removing the under metal layers and the noble metal layers in the portions of the piezoelectric resonator piece which are not covered with the resist, and forming a mask which covers regions corresponding to portions of the conduction electrodes, and which has apertures in the conduction electrode forming regions excluding the portions and in the exciting electrode forming regions, the second noble metal removing step of removing the noble metal layers exposed from the apertures, the second insulating film forming step of forming insulating films for forming the surface protecting films, and then the second insulating film removing step of removing the mask to remove the insulating films deposited on the surface of the mask.

In the present invention, the mask may be formed once, thereby decreasing the number of the production steps. This can also decrease the amount of the chemical used for removing the mask. In addition, defects are decreased by an amount corresponding to a decrease in the number of the production steps, to improve yield.

In the present invention the portions of the conduction electrodes lie in regions corresponding to the curved or bend portions of the sides of the piezoelectric resonator piece.

The method of selectively forming the insulating films in predetermined regions of the piezoelectric resonator piece comprises covering a mask on the piezoelectric resonator piece, and performing deposition or sputtering using the mask. The mask may be a resist mask.

In the invention, the use of a resist mask as the mask has the advantages that the piezoelectric resonator piece and the electrode patterns are less damaged, and the mask can be formed at low cost, as compared with a metal mask.

BRIEF DESCRIPTION OF THE DRAWINGS

FIGS. 2(A) and 2B) are perspective views of a piezoelectric resonator piece used in a piezoelectric resonator to which the present invention is applied, as viewed diagonally from above and below, respectively.

FIGS. 3(A), 3(B), and 3(C) are sectional views of a piezoelectric resonator piece taken along lines I–I, II–II' and III—III lines, respectively, in FIGS. 2(A) and 2(B).

FIGS. 4(A) to 4(E) are sectional views of portions corresponding to arms of the piezoelectric resonator piece shown in FIGS. 2(A)–2(B) and 3(A)–3(C), which respectively show the production steps up to the formation of a tuning fork type piezoelectric resonator piece.

DESCRIPTION OF THE PREFERRED EMBODIMENTS

Preferred embodiments of the present invention are described below with reference to the drawings.

Construction of Piezoelectric Resonator

First Embodiment

Figure 1:
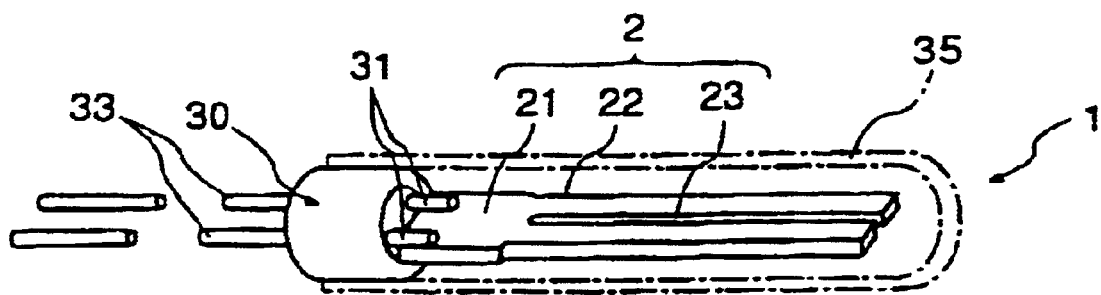
FIG. 1 is a perspective view showing the whole construction of a tuning fork type quartz crystal resonator as a piezoelectric resonator to which the present invention is applied.

FIG. 1 is a perspective view showing the whole construction of a tuning fork type quartz crystal resonator as a flexural vibration mode or longitudinal vibration mode piezoelectric resonator. FIGS. 2(A) and 2(B) are perspective views of a piezoelectric resonator piece used in the piezoelectric resonator, as viewed diagonally from above and below, respectively.

As shown in FIG. 1, a piezoelectric resonator of this embodiment comprises a piezoelectric resonator piece 2 comprising a sheet quartz crystal piece having arms 22 and 23 extended from a base 21, a plug 30 having internal terminals 31 connected to the base 21 of the piezoelectric resonator piece 2, and a case 35 for containing the piezoelectric resonator piece 2, the inside being maintained in an airtight state by the case 35 and the plug 30.

As shown in FIGS. 2(A) and 2(B), exciting electrodes 45 are formed by two electrode patterns 40 which are formed with a predetermined gap therebetween in the central portion of each of the upper side 25 and the lower side 26 of each of the arms 22 and 23 of the piezoelectric resonator piece 2. In FIGS. 2(A) and 2(B), in order to discriminate the two electrode patterns 40, one of the electrode patterns 40 is shown by lines inclined to the right, the other electrode pattern 40 being shown by lines inclined to the left.

In this embodiment, since the exciting electrodes 45 are formed in the central portion of each of the upper side 25 and the lower side 26 of each of the arms 22 and 23 of the piezoelectric resonator piece 2, the exciting electrodes formed on the upper side 25 of the piezoelectric resonator piece 2 are electrically connected to the exciting electrodes 45 on the lower side 26 through conduction electrodes 46 respectively formed by the electrode patterns on the edges 251, 252, 253, and 254 of the upper side 25, the edges 261, 262, 263 and 264 of the lower side 26, and the sides 271 and 272.

As shown in FIG. 1, therefore, the portions of the electrode patterns 40 which are formed in the base 21 are used as mounts, and the internal terminals 31 are electrically connected to the mounts by solder or a conductive adhesive so that an AC voltage is applied to the exciting electrodes 45 through external terminals 33 and the internal terminals 31 to vibrate the arms 22 and 23 at a predetermined frequency. In this case, the conduction electrodes 46 also have the function to excite the piezoelectric resonator piece 2. Each of the arms 22 and 23 has a weight part 49 formed at the front end, for controlling the frequency by laser trimming.

Construction of the Electrode Patterns 40

FIGS. 3(A), 3(B) and 3(C) are sectional views of a piezoelectric resonator piece used in a piezoelectric resonator to which the present invention is applied, taken along lines I–I', II—II and III–III' lines, respectively, in FIGS. 2(A) and 2(B).

In this embodiment, a noble metal layer such as a gold electrode layer, a silver electrode layer, or the like is used for decreasing the electric resistance of the electrode patterns 40. However, direct formation of a noble metal layer such as a gold electrode layer or silver electrode layer on the surface of the piezoelectric resonator piece 2 deteriorates adhesion between the piezoelectric resonator piece 2 and the gold electrode layer. In each of the arms 22 and 23, the gap between the electrode patterns 40 is as small as the μm order, and thus a short circuit readily occurs between the electrode patterns 40. Therefore, a surface protecting film 47 comprising a silicon oxide film is formed on the surface of each of the electrode patterns 40 by evaporation or sputtering. However, the silicon oxide film has poor adhesion to the gold electrode layer.

In this embodiment on the base 21 side of the piezoelectric resonator piece 2, the gap between the electrode patterns 40 is large to cause no probability of a short circuit between the electrode patterns 40, as shown in FIG. 3(A), and the internal terminals 31 of the plug 30 are electrically connected to the base 21 by soldering or a conductive adhesive. From this viewpoint, each of the electrode patterns 40 on the base 21 preferably comprises a gold electrode layer 42, and thus has a two layer structure comprising an under metal layer 41 and the gold electrode layer with no silicon oxide film formed as a surface protecting film.

On the other hand, the gap between the electrode patterns 40 on each of the arms 22 and 23 is as small as the μm order to easily cause a short circuit between the electrode patterns 40. Therefore, in this embodiment, in the straight portion on the front end side of each of the arms 22 and 23 of the piezoelectric resonator piece 2, the surface of each of the electrode patterns 40, which constitute at least the exciting electrodes 45 on each of the upper side 25 and the lower side 26, is covered with the surface protecting film 47 comprising a silicon oxide film, as shown in FIG. 3(B). As a result, no short circuit occurs.

However, in this portion, each of the electrode patterns 40 comprises the single under electrode layer 41, without the gold electrode layer 42. Therefore, the surface protecting film and the piezoelectric resonator apiece 2 have high adhesion therebetween.

In the curved or bent portions 276, 277, 278 and 279 of the sides 271 and 272 of the piezoelectric resonator piece 2, with only the under electrode layers 41 each comprising a chromium layer, cracks or defects occur in the under electrode layers 41 to cause disconnection in the conduction electrodes 46.

Therefore, in this embodiment, in the curved or bent portions 276, 277, 278 and 279 of the sides 271 and 272 of the piezoelectric resonator piece 2, each of the electrode patterns has a two layer structure comprising the under metal layer 41 comprising a chromium layer, and the gold electrode layer 42 having excellent malleability, as shown in FIG. 3(C). Therefore, in these portions, even with the base metal layers 4 open, electrical connection can be ensured by the gold electrode layers 42. Therefore, the conduction electrodes 46 do not become open due to cracks or defects in the under metal layers 41 between the upper side 25 and the lower side 26 of the piezoelectric resonator piece 2. Thus, in the piezoelectric resonator of this embodiment, even when the gold electrode layers 42 are removed from regions, which mostly occupy the formation regions of the surface protecting films 47, in order to increase adhesion of the surface protecting films 47, the exciting electrodes 45 on the upper side 25 of the piezoelectric resonator piece 2 can be securely electrically connected to those on the lower side 26. Furthermore, in use of a metal mask which will be described below, the surface protecting films 47 are formed directly on the surfaces of the gold electrode layers 42 only in the curved or bent portions 276, 277, 278 and 279 of the sides 271 and 272 of the piezoelectric resonator piece 2 of the regions where the surface protecting films 47 are formed. These curved or bent portions occupy only a narrow region of the whole, and there is thus no probability of deteriorating adhesion between the surface protecting films 47 and the piezoelectric resonator piece 2 (refer to FIG. 8(B)).

First Method of Producing the Piezoelectric Resonator 1

The method of producing the piezoelectric resonator 1 having the above construction will be described with reference to FIGS. 4(A) to 7. Although the production process described here comprises a portion common to the semiconductor process, in the case of a piezoelectric resonator, the same pattern is formed on both sides of a wafer unlike the semiconductor process. FIGS. 4(A)–6(E) are sectional views showing the sections of portions corresponding to the two arms 22 and 23 in the curved portions 276, 277, 278 and 279 of the sides 271 and 272 of the piezoelectric resonator piece 2.

First, as shown in FIG. 4(A), a cut quartz crystal wafer 20 is polished and washed, and as shown in FIG. 4(B), and chromium layers Cr and gold layers Au are deposited to a thickness of hundreds to about 2000 angstroms under vacuum. The reason for forming the chromium layers Cr is that with only the gold layers, adhesion to the quartz crystal wafer 20 is poor.

Next, photoresist for forming a tuning fork shape is formed, baked in a tuning fork-shaped pattern, and then developed to form tuning fork-shaped photoresist R1, as shown in FIG. 4(C). The gold layers Au and the chromium layers Cr are etched by using the tuning fork-shaped photoresist R1 as a mask to leave the gold layers Au and the chromium layers Cr in a tuning fork shape, as shown in FIG.

4(D). Next, the quartz crystal wafer 20 is etched with an etching solution containing hydrofluoric acid and ammonium fluoride by using the gold layers Au and the chromium layers Cr as a mask to form the quartz crystal in the tuning fork shape, as shown in FIG. 4(E). In this way, the piezoelectric resonator piece 2 is formed.

Figure 5A:
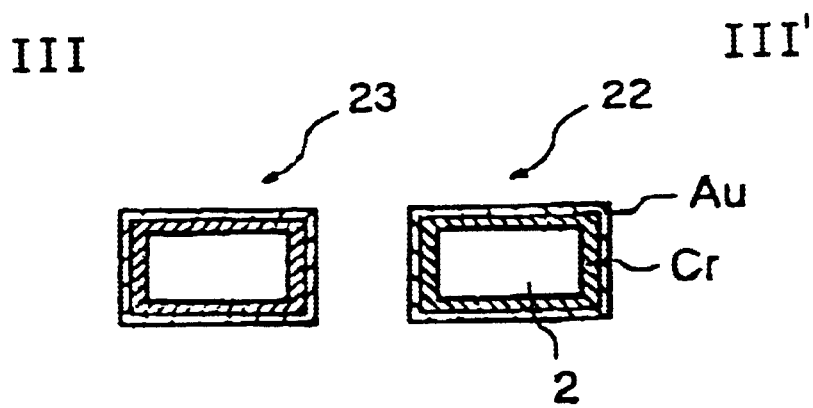
FIGS. 5(A) to 5(C) are sectional views of portions corresponding to arms of the piezoelectric resonator piece shown in FIGS. 2(A)–2(B) and 3(A)–3(C); which respectively show the production steps from the formation of a tuning fork type piezoelectric resonator piece to the formation of electrode patterns.

All the gold layers Au and the chromium layers Cr on the piezoelectric resonator piece 2 are next removed, and new chromium layers Cr and gold layers Au are formed for forming the electrode patterns 40, as shown in FIG. 5(A).

Figure 5B:
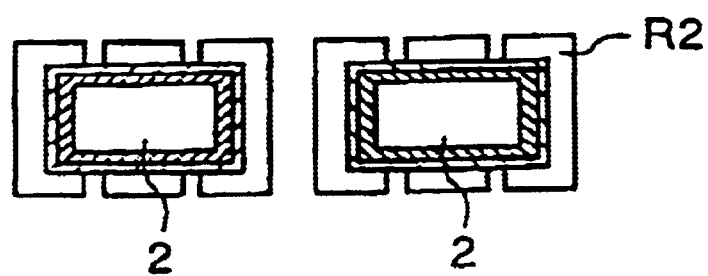

Photoresist for forming the electrode patterns is next formed, baked in the pattern shape of each of the electrode patterns 40, and then developed to leave photoresist R2 in the pattern shape of each of the electrode patterns 40, as shown in FIG. 5(B).

Figure 5C:
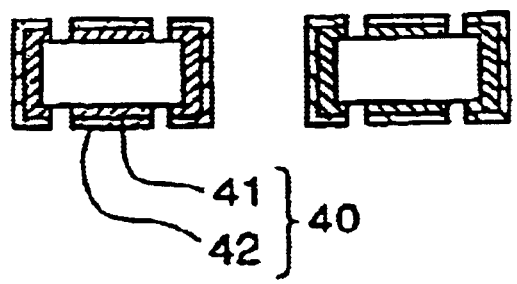

The gold layers Au and the chromium layers Cr are next etched by using the photoresist R2 as a mask to leave the gold layers Au and the chromium layers Cr in the patterns of the electrode patterns 40, as shown in FIG. 5(C) (the first electrode pattern forming step). As a result, the electrode patterns 40 each comprising the under metal film 41 made of the chromium layer Cr and the gold electrode layer 42 made of the gold layer Au are formed.

Figure 6A:
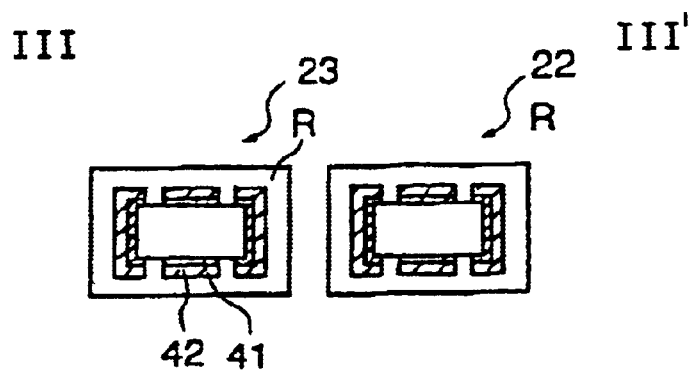
FIGS. 6(A) to 6(E) are sectional views of portions corresponding to arms of the piezoelectric resonator piece shown in FIGS. 2(A)–2(B) and 3(A)–3(C); which respectively show the production steps from the formation of electrode patterns to the formation of insulating films.
Figure 6B:
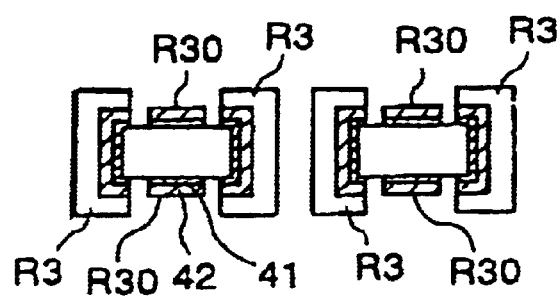

Photoresist R for separating gold and forming insulating films is next coated to cover the entire surfaces of the arms 22 and 23 of the piezoelectric resonator piece 2, as shown in FIG. 6(A), baked and then developed to form a resist mask R3 having apertures R30 in portions corresponding to at least the exciting electrodes 45, preferably the exciting electrodes 45 and the gaps between the exciting electrodes 45 and the conduction electrodes 46, on each of the upper side 25 and the lower side 26 of the piezoelectric resonator piece 2, as shown in FIG. 6(B) (the first mask forming step).

Figure 6C:
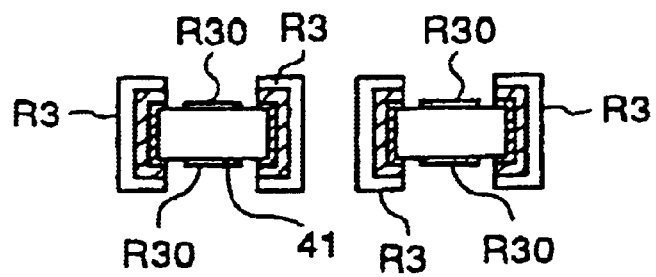

Next, etching is carried out through the apertures R30 of the resist mask R3 to remove the gold electrode layers 42 from the electrode patterns 40 which constitute the exciting electrodes 45, as shown in FIG. 6(C). As a result, each of the exciting electrodes 45 comprises only the under electrode layer 41 comprising a chromium layer (the first noble metal removing step).

Figure 6D:
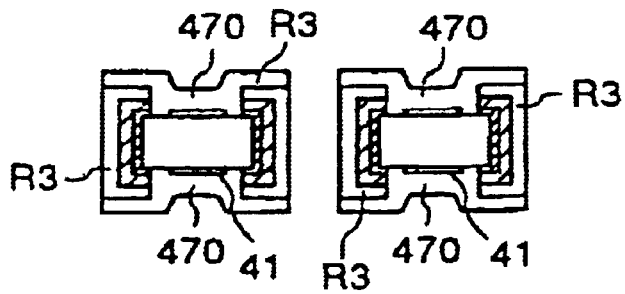

An insulating film 470 is next formed on each of the upper side 25 and the lower side 26 of the piezoelectric resonator piece 2, as shown in FIG. 6(D) (the first insulating film forming step).

Figure 6E:
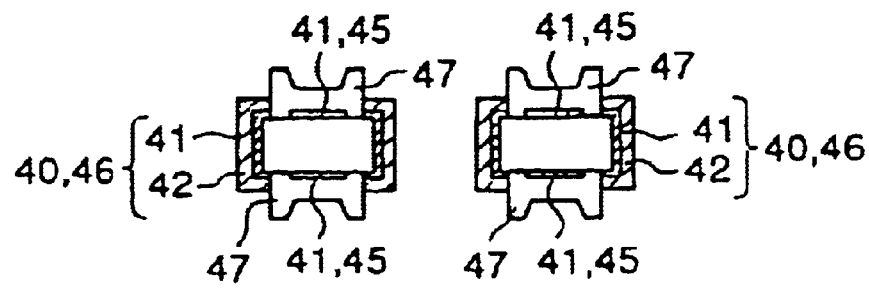

As shown in FIG. 6(E), the resist mask R3 is next removed. At this time, like a lift off method used in the semiconductor process, the insulating films 470 formed on the surface of the resist mask R3 are removed to leave the insulating films 470 as the surface protecting films 47 only in the predetermined regions of the piezoelectric resonator piece 2 (the first insulating film removing step). Also, a structure is formed, in which the exciting electrodes 45 each of which comprises a chromium layer (the under metal film 41) are formed below the surface protecting films 47. Furthermore, as described above with reference to FIGS. 2(A) and 2(B), the conduction electrodes 46, each of which comprises the under electrode layer 41 comprising the chromium layer, and the metal electrode layer 42, are respectively formed on the edges 251, 252, 23, and 254 of the upper side 25, the edges 261, 262, 263, and 264 of the lower side, and the sides 271 and 272 of the piezoelectric resonator piece 2.

The surface protecting films 47 can also be formed by mask evaporation or mask sputtering through a metal mask, as described below with reference to FIGS. 8(A) and 8(B). However, as described above with reference to FIGS. 6(A)–6(E); the method of forming the surface protecting films 47 in the predetermined regions of the piezoelectric resonator piece 2 by using the resist mask R3 has the advantages that unlike use of the metal mask, the piezoelectric resonator piece 2 and the exciting electrodes 45 are not damaged, and the mask can be formed at low cost.

Figure 7:
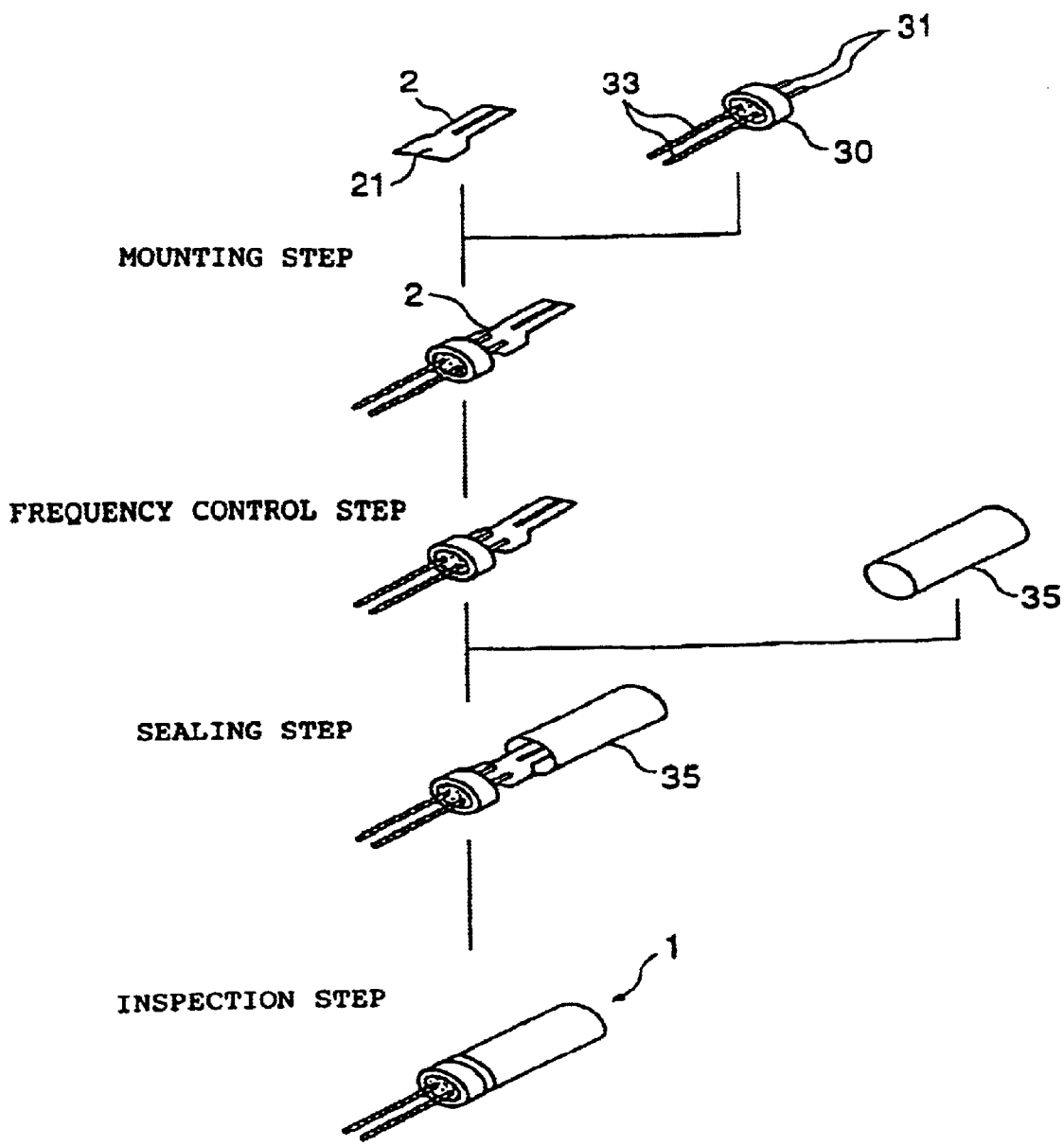
FIG. 7 is a drawing showing the steps of assembling the piezoelectric resonator shown in FIG. 1 after the formation of insulating films on the piezoelectric resonator piece.

In the piezoelectric resonator piece 2 produced as described above, the internal terminals 31 of the plug 30 are soldered to the base 21, as shown in FIG. 7. In this state, the frequency of the piezoelectric resonator piece 2 is controlled by laser-trimming the weight parts 49 each comprising a gold electrode layer and respectively formed at the ends of the arms 22 and 23 of the piezoelectric resonator piece 2. Then, the plug 30 is pressed into the case 35 in a vacuum chamber to produce the piezoelectric resonator 1. The characteristics of the piezoelectric resonator 1 are inspected.

Figure 8A:
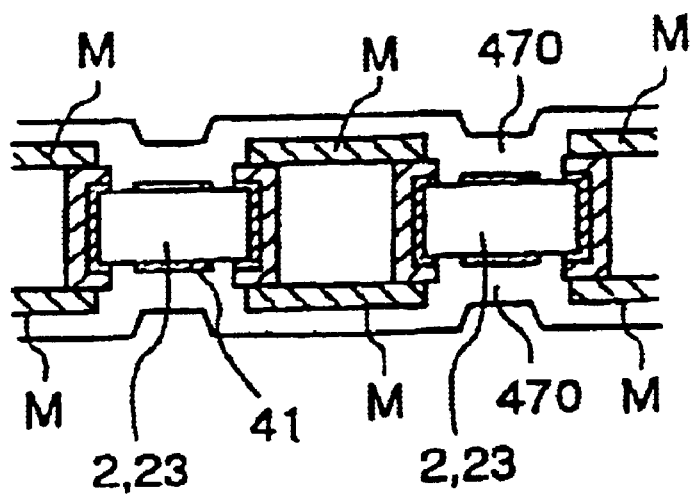
FIGS. 8(A) and 8(B)) are sectional views showing the steps of forming insulating films by using a metal mask in the process for producing the piezoelectric resonator piece shown in FIGS. 2(A)–2(B) and 3(A)–3(C)
Figure 8B:
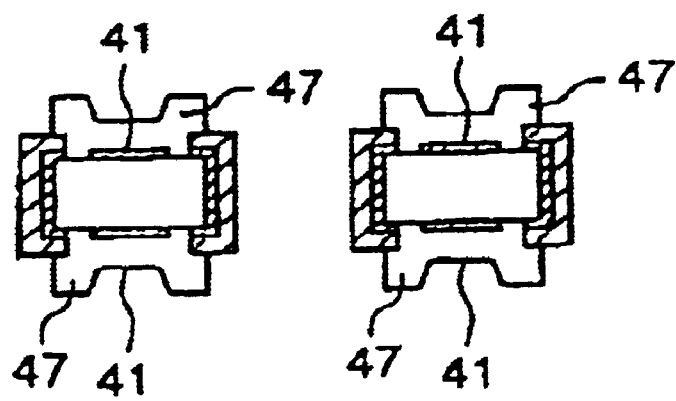

The mask evaporation or mask sputtering through the metal mask comprises covering the surface of the piezoelectric resonator piece 2 with the metal mask M, as shown in FIG. 8(A), performing mask evaporation or mask sputtering of the insulating film 470 through the metal mask M, and then removing the metal mask M, as shown in FIG. 8(B). This production method can also leave the insulating film 470 as the surface protecting films 47 only in the predetermined regions of the piezoelectric resonator piece 2.

Second Embodiment

A piezoelectric resonator according to a second embodiment has the same construction as the piezoelectric resonator according to the first embodiment. The production method is different from the first embodiment, and thus different points of the production method are described below.

Second Method of Producing the Piezoelectric Resonator

The second method of producing the piezoelectric resonator 1 will be described with reference to FIGS. 4(A)–4(E), 7, 9(A)–9(C) and 10(A)–10(D). Although the production process described here comprises a portion common to the semiconductor process, in the case of a piezoelectric resonator, the same pattern is formed on both sides of a wafer unlike the semiconductor process. FIGS. 4(A)–4(E), 9(A)–9(C) and 10(A)–10(D) are sectional views showing the sections of portions corresponding to the two arms 22 and 23 in the curved portions 276, 277, 278 and 279 of the sides 271 and 272 of the piezoelectric resonator piece 2.

In the second production method, the piezoelectric resonator piece 2 is produced through the same steps as those of the first production method shown in FIG. 4, and thus description of the steps shown in FIGS. 4(A)–4(E) is omitted. After the steps shown in FIGS. 4(A)–4(E), the piezoelectric resonator piece 2 has the construction shown in FIG. 9(A).

Figure 9A:
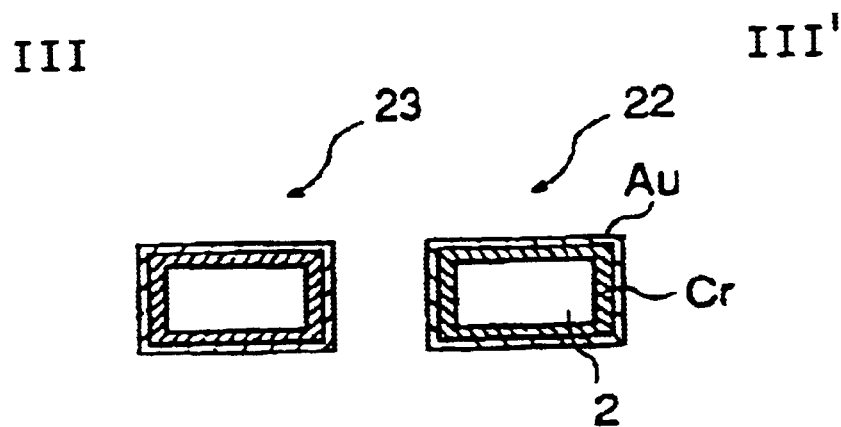
FIGS. 9(A) to 9(C) are sectional views of portions corresponding to arms of the piezoelectric resonator piece shown in FIGS. 2(A)–2(B) and 3(A)–3(C); which respectively show the steps from the formation of a tuning fork type piezoelectric resonator piece to the formation of electrode patterns in another production process.

All the gold layers Au and the chromium layers Cr on the piezoelectric resonator piece 2 are next removed, and new chromium layers Cr and gold layers Au are formed for forming the electrode patterns 40, as shown in FIG. 9(A).

Figure 9B:
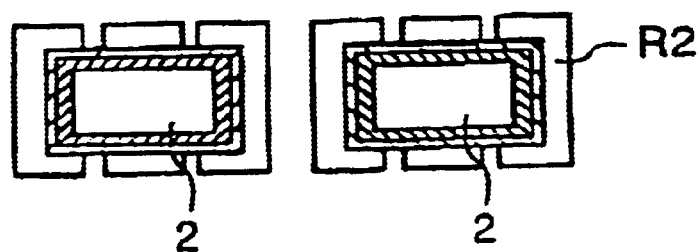

Photoresist for forming the electrode patterns is next formed, baked in the pattern shape of each of the electrode patterns 40, and then developed to leave photoresist R2 in the pattern shape of each of the electrode patterns 40, as shown in FIG. 9(B). For example, the photoresist R2 is positive type photoresist (OFPR resist).

Figure 9C:
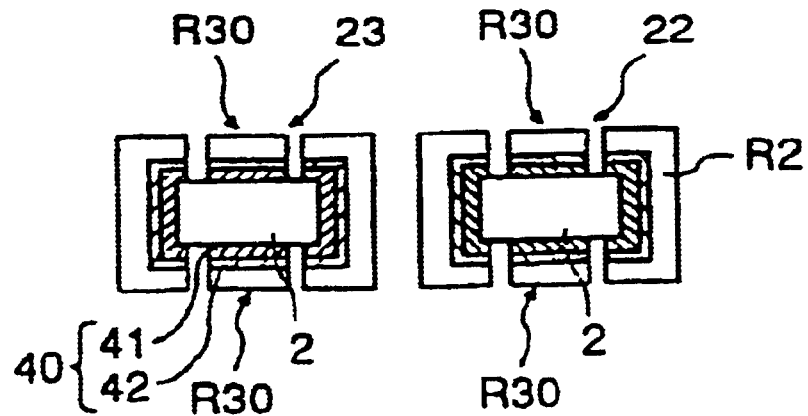

The gold layers Au and the chromium layers Cr are next etched by using the photoresist R2 as a mask to leave the gold layers Au and the chromium layers Cr in the patterns of the electrode patterns 40, as shown in FIG. 9(C) (the second electrode pattern forming step). As a result, the electrode patterns 40 each comprising the under metal film 41 made of the chromium layer Cr and the gold electrode layer 42 made of the gold layer Au are formed below the photoresist R2.

Figure 10A:
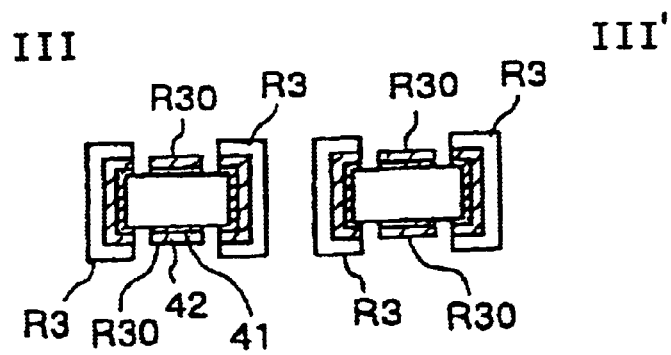
FIGS. 10(A) to 10(D) are sectional views of portions corresponding to arms of the piezoelectric resonator piece shown in FIGS. 2(A)–2(B) and 3(A)–3(C); which respectively show the steps from the formation of electrode patterns to the formation of insulating films in another production process.

The photoresist R2 is next removed by exposure from the portions which cover the exciting electrodes 45 on each of the upper side 25 and the lower side 26 of the piezoelectric resonator piece 2 to form a resist mask R3 having apertures R30 in portions corresponding to the exciting electrodes 45 and the gaps between the exciting electrodes 45 and the conduction electrodes 46, as shown in FIG. 10(A) (the second mask forming step).

Figure 10B:
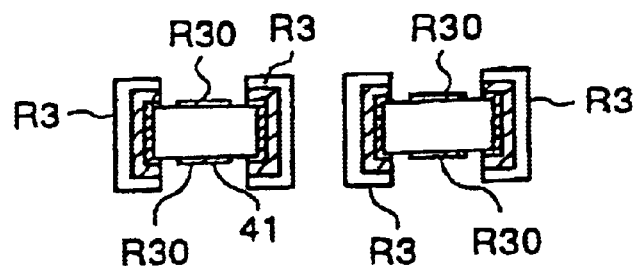

Etching is next carried out through the apertures R30 of the resist mask R3 to remove the gold electrode layers 42 from the electrode patterns 40 which constitute the exciting electrodes 45, as shown in FIG. 10(B). As a result, each of the exciting electrodes 45 comprises only the under electrode layer 41 comprising the chromium layer (the second noble metal removing step).

Figure 10C:
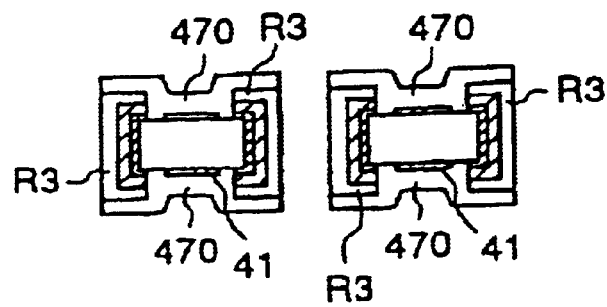

An insulating film 470 is next formed on each of the upper side 25 and the lower side 26 of the piezoelectric resonator piece 2, as shown in FIG. 10(C) (the second insulating film forming step).

Figure 10D:
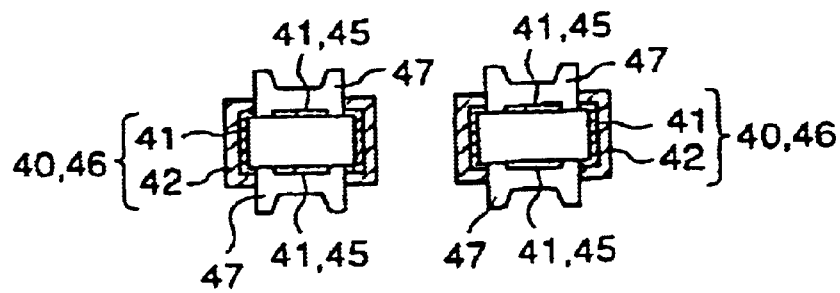
Figure 11:
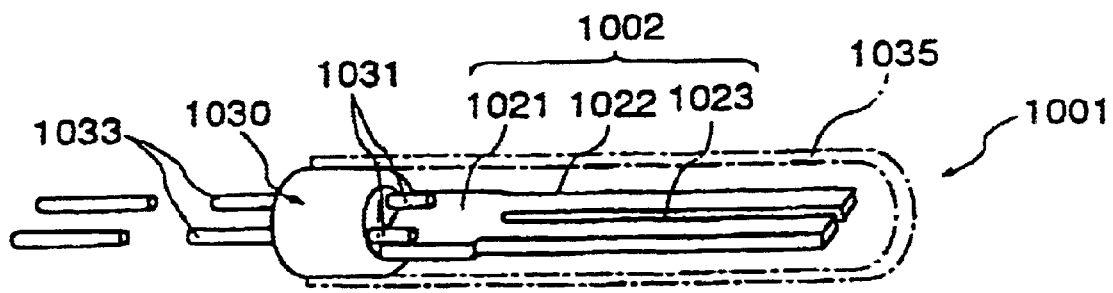
FIG. 11 is a perspective view showing the whole construction of a tuning fork type quartz crystal resonator of conventional piezoelectric resonators.
Figures 12A, 12B:
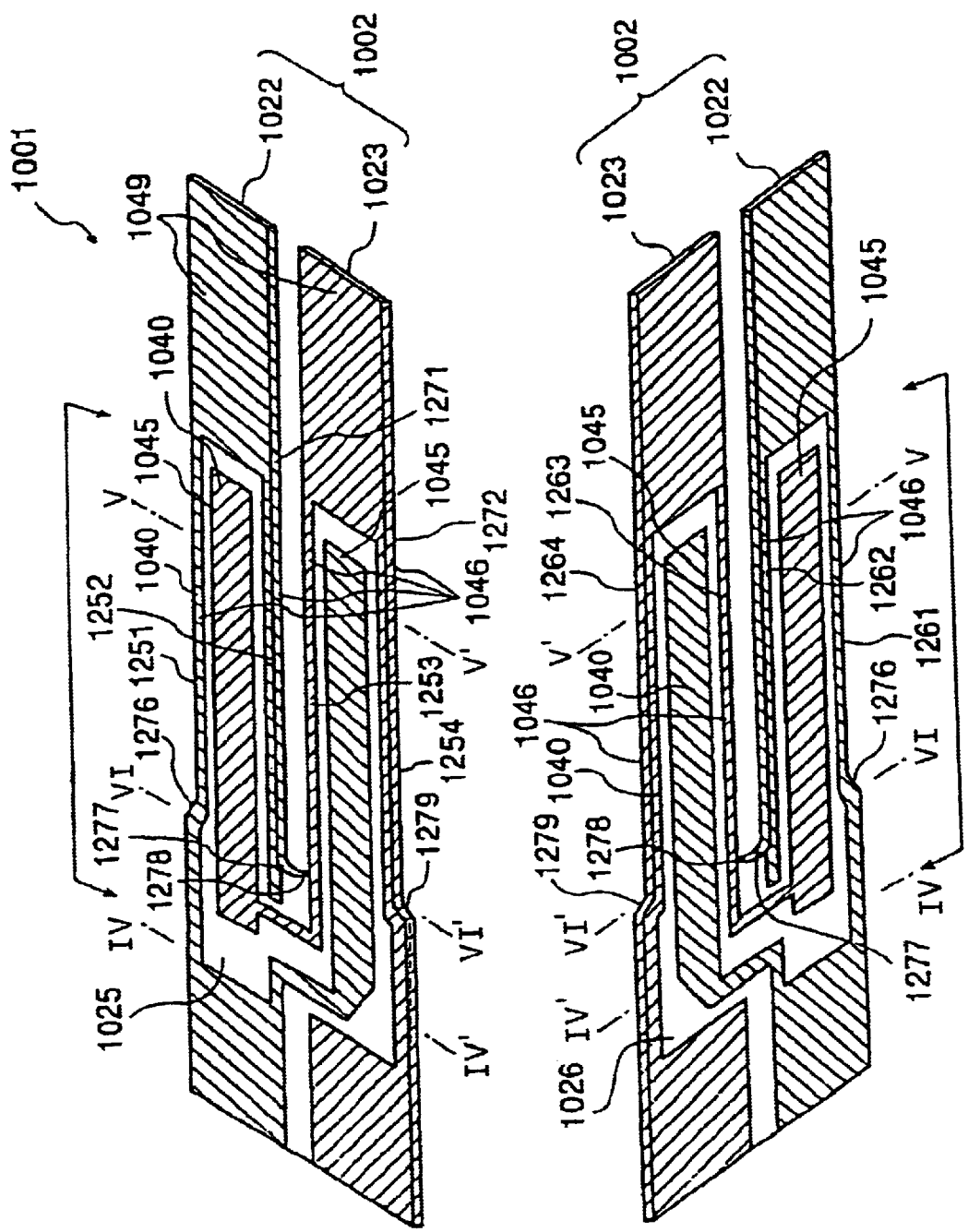
FIGS. 12(A) and 12(B) are perspective views of a piezoelectric resonator piece used in a conventional piezoelectric resonator as viewed diagonally from above and below, respectively.
Figure 13A:
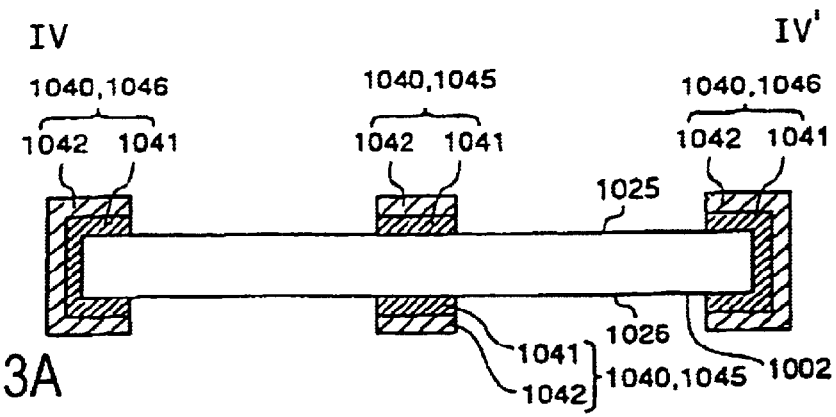
FIGS. 13(A), 13(B) and 13(C) are sectional views of a piezoelectric resonator piece used in a conventional piezoelectric resonator taken along lines IV–IV' and VI–VI' lines, respectively, in FIGS. 12(A) and 12(B).
Figure 13B:
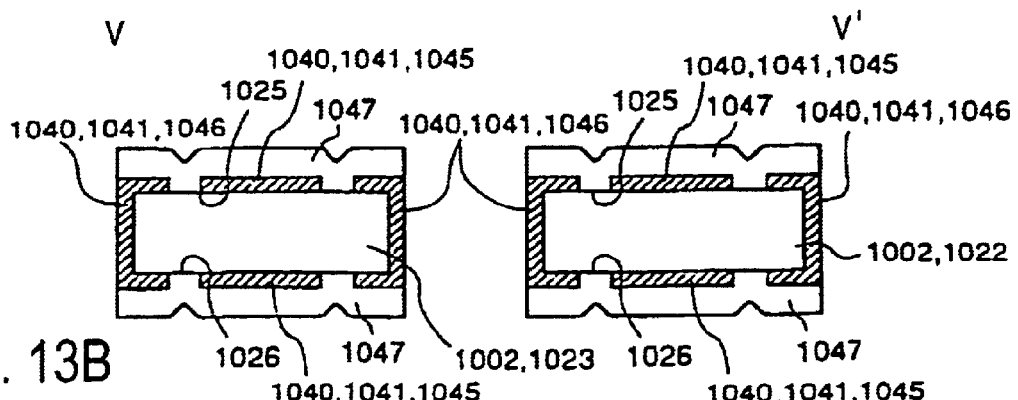
Figure 13C:
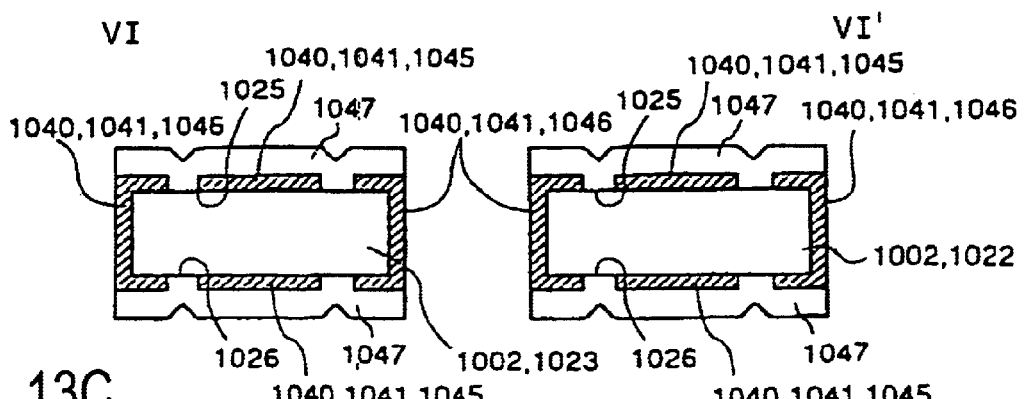

As shown in FIG. 10(D), the resist mask R3 is then removed. At this time, like the lift off method used in the semiconductor process, the insulating films 470 formed on the surface of the resist mask R3 are removed to leave the insulating films 470 as the surface protecting films 47 only in the predetermined regions of the piezoelectric resonator piece 2 (the second insulating film removing step). Also, a structure is formed, in which the exciting electrodes 45 each of which comprises the chromium layer (the under metal film 41) are formed below the surface protecting films 47. Furthermore, as described above with reference to FIGS. 2(A)–2(B), the conduction electrodes 46, each of which comprises the under electrode layer 41 comprising the chromium layer, and the metal electrode layer 42, are respectively formed on the edges 251, 252, 23, and 254 of the upper side 25, the edges 261, 262, 263, and 264 of the lower side, and the sides 271 and 272 of the piezoelectric resonator piece 2.

The surface protecting films 47 can also be formed by mask evaporation or mask sputtering through a metal mask, as described below with reference to FIGS. 8(A)–8(B). However, as in the embodiment described above with reference to FIGS. 10(A)–10(B), the method of forming the surface protecting films 47 in the predetermined regions of the piezoelectric resonator piece 2 by using the resist mask R3 has the advantages that unlike use of the metal mask, the piezoelectric resonator piece 2 and the exciting electrodes 45 are not damaged, and the mask can be formed at low cost.

In the piezoelectric resonator piece 2 produced as described above, the internal terminals 31 of the plug 30 are soldered to the base 21, as shown in FIG. 7. In this state, the frequency of the piezoelectric resonator piece 2 is controlled by laser-trimming the weight parts 49 each comprising a gold electrode layer and respectively formed at the ends of the arms 22 and 23 of the piezoelectric resonator piece 2. Then, the plug 30 is pressed into the case 35 in a vacuum chamber to produce the piezoelectric resonator 1. The characteristics of the piezoelectric resonator 1 are inspected.

The mask evaporation or mask sputtering through the metal mask comprises covering the surface of the piezoelectric resonator piece 2 with the metal mask M, as shown in FIG. 8(A), performing mask evaporation or mask sputtering of the insulating film 470 through the metal mask M, and then removing the metal mask M, as shown in FIG. 8(B). This production method can also leave the insulating film 470 as the surface protecting films 47 only in the predetermined regions of the piezoelectric resonator piece 2.

Unlike the first production method, the second production method reuses the unexposed portions of the photoresist, and comprises only one time of photoresist coating, thereby decreasing the number of the production steps. Thus, the second production method can decrease the amount of the chemicals used for removing the photoresist. Also the second production method causes no defect due to a decrease in the number of the production steps, thereby improving yield.

Other Embodiments

Although the above-described embodiments use the gold electrode layers 42 as noble metal layers, use of silver electrode layers also exhibits the same effect as described above.

As described above, in the present invention, the electrode patters having a two layer structure comprising the under metal layer and the noble metal layer are formed to decrease electric resistance, and each of the electrode patters for forming the exciting electrodes comprises only the single under metal layer. Also, each of the electrode patterns for forming the conduction electrodes comprises only the single under metal layer except portions ranging from the upper side to the lower side through the sides of a piezoelectric resonator piece. Therefore, the insulating surface protecting films are formed on the surfaces of the piezoelectric resonator piece with good adhesion so as to cover at least the exciting electrodes on the upper side and the lower side of the piezoelectric resonator piece. The electrode patterns which constitute the conduction electrodes have a two layer structure comprising the under metal layer and the noble metal layer in the portions ranging from the upper side to the lower side of a piezoelectric resonator piece through the sides. Therefore, even when cracks or defects occur in these portions, electrical connection is ensured by the noble metal layers in the portions. Thus, the exciting electrodes are not brought into an open sate between the upper side and the lower side of the piezoelectric resonator piece, and even when the noble metal layers are partially removed for increasing adhesion of the surface protecting films, it is possible to prevent the occurrence of the problems of increasing the CI value or disenabling oscillation, and thus realize a piezoelectric resonator having high reliability. Although a cylindrical case type piezoelectric resonator in which a plug is pressed into a case is described above, the present invention is not limited to the above-described embodiments, and can be widely applied to a surface mounting type piezoelectric resonator using a ceramic package and a can type piezoelectric resonator.

Industrial Applicability

The present invention is suitable for use as a piezoelectric resonator such as a quartz crystal resonator, and a method of producing the same. Particularly, the present invention is suitable for use as the technique of electrically connecting electrodes formed in a piezoelectric resonator piece, and preventing a short circuit.

What is claimed is:

1. A piezoelectric resonator, comprising:
    a flat plate piezoelectric resonator piece;
    exciting electrodes formed on each of the upper side and the lower side of the piezoelectric resonator piece from electrode patterns formed on the piezoelectric resonator piece;

conduction electrodes formed from the electrode patterns on the edges of the upper side, the edges of the lower side, and the sides of the piezoelectric resonator piece so as to electrically connect the exciting electrodes; and insulating surface protecting films formed on the upper and lower sides of the piezoelectric resonator piece to cover at least the exciting electrodes, each of the electrode patterns comprising an under metal layer formed on the surface of the piezoelectric resonator piece, and a noble metal layer formed on the surface of the under metal layer, each of the electrode patterns of the exciting electrodes comprising the under metal layer, and each of the electrode patterns of the conduction electrodes comprising the under metal layer and not comprising the noble metal layer except portions ranging from the upper side to the lower side through the sides of the piezoelectric resonator piece, each of the electrode patterns in the portions comprising the under metal layer and the noble metal layer, the portions of the conduction electrodes lying in regions corresponding to curved or bent portions of the sides of the piezoelectric resonator piece.

2. The piezoelectric resonator according to claim 1, the noble metal layer being formed of gold.

3. The piezoelectric resonator according to claim 1, the noble metal layer being formed of silver.

4. The piezoelectric resonator according to claim 1, the under metal layer being formed of chromium.

* * * * *